United States Patent
Yang et al.

(10) Patent No.: US 7,001,836 B2
(45) Date of Patent: Feb. 21, 2006

(54) TWO STEP TRENCH DEFINITION PROCEDURE FOR FORMATION OF A DUAL DAMASCENE OPENING IN A STACK OF INSULATOR LAYERS

(75) Inventors: Fu-Kai Yang, Shulin (TW); Shu-Huei Suen, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 92 days.

(21) Appl. No.: 10/808,802

(22) Filed: Mar. 25, 2004

(65) Prior Publication Data

US 2005/0215051 A1 Sep. 29, 2005

(51) Int. Cl.
 *H01L 21/4763* (2006.01)

(52) U.S. Cl. .............. 438/624; 438/634; 438/636; 438/637; 438/638; 438/643; 438/666; 438/700

(58) Field of Classification Search ........ 438/624–627, 438/629, 631–634, 636–638, 643, 645–646, 438/648, 653, 656, 660, 663, 669, 672, 674–675, 438/685, 687, 692, 700, 666
See application file for complete search history.

(56) References Cited

U.S. PATENT DOCUMENTS

| | | | | |
|---|---|---|---|---|
| 6,211,035 | B1 | 4/2001 | Moise et al. | 438/396 |
| 6,211,063 | B1 | 4/2001 | Liu et al. | 438/624 |
| 6,251,774 | B1 * | 6/2001 | Harada et al. | 438/637 |
| 6,297,149 | B1 * | 10/2001 | Stamper | 438/637 |
| 6,642,153 | B1 * | 11/2003 | Chang et al. | 438/725 |
| 2002/0192945 | A1 * | 12/2002 | Nagahara | 438/637 |
| 2005/0054194 | A1 * | 3/2005 | Tsai et al. | 438/638 |

* cited by examiner

*Primary Examiner*—Lynne A. Gurley

(57) ABSTRACT

A process for defining a dual damascene opening in a stack of insulator layers to expose a portion of a top surface of an underlying conductive structure, has been developed. The process features a two step procedure for removal of insulator stop layers, wherein the stop layers are employed to allow selective dry etch procedures to be used for definition of both the via opening component and the trench shape component of the dual damascene opening. After definition of the via opening, terminating at the top surface of an underlying, first silicon nitride stop layer, a photoresist shape is used as an etch mask to allow a dry etch procedure to define a trench shape in a top portion of an insulator stack, with the dry etch procedure terminating at the top surface of an overlying second silicon nitride stop layer. The dry etch procedure also results in formation of a photoresist plug in the via hole, located on an underlying, first silicon nitride stop layer. The portion of the second silicon nitride stop layer exposed in the trench shape opening is next selectively removed via a first procedure of the two step, dry etch removal procedure, followed by removal of the trench shape defining photoresist shape and of the photoresist plug. Another dry etch procedure, the second step of the two step dry etch removal procedure, is next performed to selectively remove the portion of underlying, first silicon nitride stop layer exposed in the via opening, resulting in exposure of a portion of the top surface of the conductive structure. The two step, stop layer removal procedure reduces the level of insulator corner rounding at the top of the dual damascene opening, while also reducing damage to the top surface of the underlying conductive structure, exposed at the bottom of the dual damascene opening.

29 Claims, 4 Drawing Sheets

TWO STEP TRENCH DEFINITION PROCEDURE FOR FORMATION OF A DUAL DAMASCENE OPENING IN A STACK OF INSULATOR LAYERS

BACKGROUND OF THE INVENTION (1) Field of the Invention

The present invention relates to methods used to fabricate semiconductor devices, and more specifically to a method used to form a dual damascene opening in a stack of insulator layers to expose an underlying conductive gate structure.

(2) Description of the Prior Art

Dual damascene openings formed in insulator layers has enabled conductive via structures as well as overlying conductive interconnect structures to be defined simultaneously in the dual damascene opening. One method of forming a dual damascene opening is to first define a narrow diameter via opening in an entire stack of insulator layers, exposing a top surface of an underlying conductive interconnect structure, followed by definition of a wider diameter trench shape in a top portion of the same insulator layer stack. The above procedure can however result in damage to the top surface of the exposed underlying conductive interconnect structure during the trench definition procedure, resulting in possible higher than desired interface resistance when overlaid with an conductive via structure. In addition other dual damascene opening procedures can also result in loss of insulator thickness as well as corner rounding of the exposed top insulator component of the via opening occurring during various stages of the definition procedure.

The present invention will describe a procedure for formation of a dual damascene opening in a stack of insulator layers in which a critical process step, the step used to remove all stop or liner layers, is accomplished using a two step removal sequence which reduces the risk of corner rounding of an top insulator layer, as well as reducing the risk of damage to an exposed underlying conductive interconnect structure. In addition to the novel two step stop layer removal procedure the present invention will describe etch chemistries and selectivities which also reduce the risk of damage to the underlying conductive interconnect structure during the dual damascene opening procedure. Prior art such as Liu et al, in U.S. Pat. No. 6,211,063 B1, as well as Moise et al, in U.S. Pat. No. 6,211,035 B1, describe methods of forming self aligned conductive structures in a dual damascene opening, as well as simultaneously forming openings to multiple conductive structures located at various levels. These prior art however do not describe the novel process sequence and etch chemistry employed in the present invention for dual damascene openings in an insulator stack in which corner rounding, loss of top insulator layer thickness, as well as damage to an exposed underlying conductive structure, is reduced as a result of the two step stop layer removal procedure.

SUMMARY OF THE INVENTION

It is an object of this invention to form a dual damascene opening in a stack of insulator layers to expose a top surface of an underlying conductive structure.

It is another object of this invention to employ a two step, dry etching procedure in the dual damascene opening procedure for removal of the stop or liner layers used as components in the stack of insulator layers, to reduce the risk of corner rounding of a capping insulator layer component of the stack of insulator layers.

It is still another object of this invention to employ the two step, dry etching procedure in the dual damascene procedure for removal of the stop or liner layers used as components of the stack of insulator layers, to reduce the risk of damage to the top surface of an underlying conductive structure, exposed at the dual damascene opening at the conclusion of the dual damascene opening procedure.

In accordance with the present invention a process of defining a dual damascene opening in a stack of insulator layers featuring a two step dry etching procedure, used for removal of stop or finer layer components of the insulator stack, is described. A stack of insulator layers comprised of, underlying silicon nitride stop or liner layer, a fluorinated silica glass layer, an overlying silicon nitride stop or liner layer, an overlying silicon oxide layer, an anti-reflective coating layer, and a silicon oxide capping layer, is formed on an underlying conductive structure. A first photoresist shape is used for definition of a narrow diameter via opening in the stack of insulator layers, with the via opening component of the dual damascene opening terminating within the underlying silicon nitride stop layer. Formation of second photoresist shape fills the narrow diameter opening, with the second photoresist shape comprised with a trench shape opening exposing portions of the top surface of the silicon oxide capping layer. A dry etch procedure is employed to allow the trench shape of the dual damascene opening procedure to be defined in top components of the insulator stack, with the trench definition procedure terminating at the appearance of the top surface of the overlying silicon nitride stop layer, with the dry etch procedure also resulting in the formation of a photoresist plug located in a bottom portion of the narrow diameter via opening. With the photoresist plug protecting underlying materials a first phase of the two step dry etching procedure is initiated removing the portion of the overlying silicon nitride stop layer exposed in the trench opening. After removal of the photoresist plug a second phase of the two step dry etch procedure is employed to selectively remove the portion of the partially etched, underlying silicon nitride stop layer exposed at the bottom of the via opening, resulting in exposure of a portion of a top surface of the underlying conductive structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
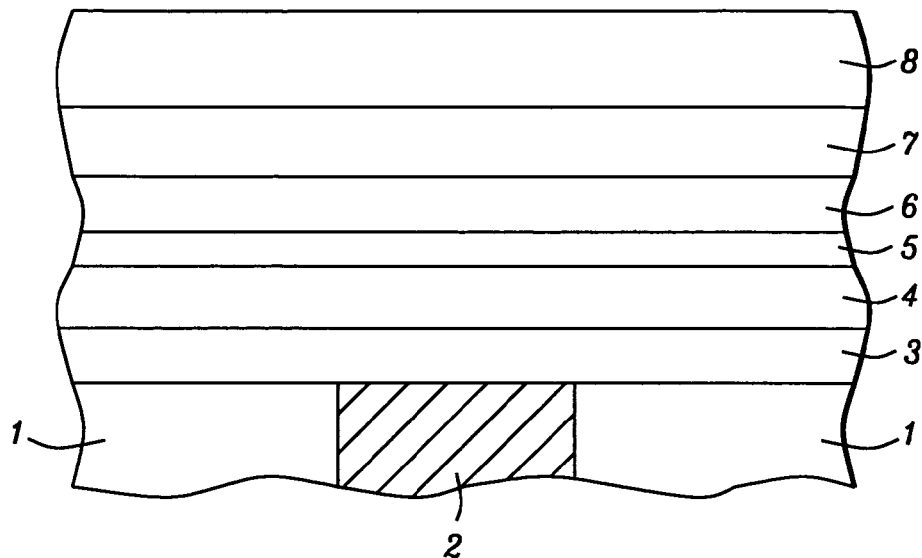
FIGS. 1–7, which schematically in cross-sectional style show key stages used to define a dual damascene opening in a stack of insulator layers, featuring a two step procedure employed for removal of the stop or liner layer components of the insulator stack.

The method of defining a dual damascene opening in a stack of insulator layers, featuring a two step procedure employed for removal of the stop or liner layer components of the insulator stack, will now be described in detail. Conductive structure 2, a structure comprised of a material such as a copper, is shown schematically shown in FIG. 1, embedded in insulator layer 1, wherein insulator layer 1, can be comprised of silicon oxide, or a boro-phosphosilicate glass (BPSG). First liner or stop layer 3, a layer such as silicon nitride, is deposited to a thickness between about 400 to 600 Angstroms via plasma enhanced chemical vapor deposition (PECVD) procedures. Insulator layer 4, a fluorinated silica glass (FSG) layer, is next formed on first liner layer 3, at a thickness between about 250 to 1000 Angstroms via PECVD procedures. Second liner layer 5, again a layer such as silicon nitride, is next deposited to a thickness between about 200 to 400 Angstroms via PECVD procedures. Insulator layer 6, comprised of silicon oxide, is deposited on second silicon nitride layer 5, at a thickness between about 500 to 1000 Angstroms via PECVD procedures. Anti-reflective coating (ARC) 7, a layer such as silicon oxynitride, is next formed on insulator layer 6, at a thickness between about 500 to 700 Angstroms, via PECVD or physical vapor deposition (PVD) procedures, followed by deposition of capping oxide layer 8, a silicon oxide layer, formed to a thickness between about 506 to 700 Angstroms via PECVD procedures. The result of these procedures is schematically shown in FIG. 1.

Figure 2:
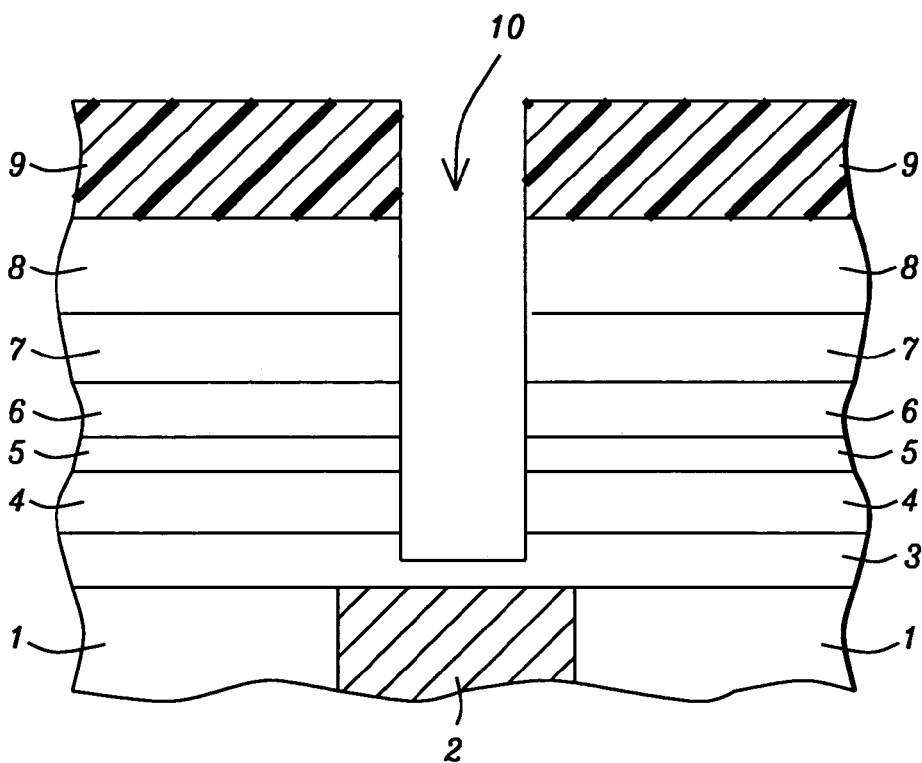

First photoresist shape 9, is next employed to allow an anisotropic reactive ion etching (RIE), procedure to define narrow diameter, via opening 10, in capping oxide layer 8, in ARC layer 7, in insulator layer 6, in second liner layer 5, and in FSG layer 4, with the anisotropic RIE procedure terminating in a top portion of first liner layer 3. The anisotropic RIE procedure is performed using $CHF_3$ as an etchant for capping oxide layer 8, insulator layer 7, ARC layer 6, and for FSG layer 4, while either $CF_4$ or $CH_xF_y$ is used as a selective etchant for silicon nitride, second finer layer 5. The diameter of via opening 10, is between about 0.25 to 2.5 urn. The result of the above via opening definition procedure is schematically shown in FIG. 2.

Figure 3:
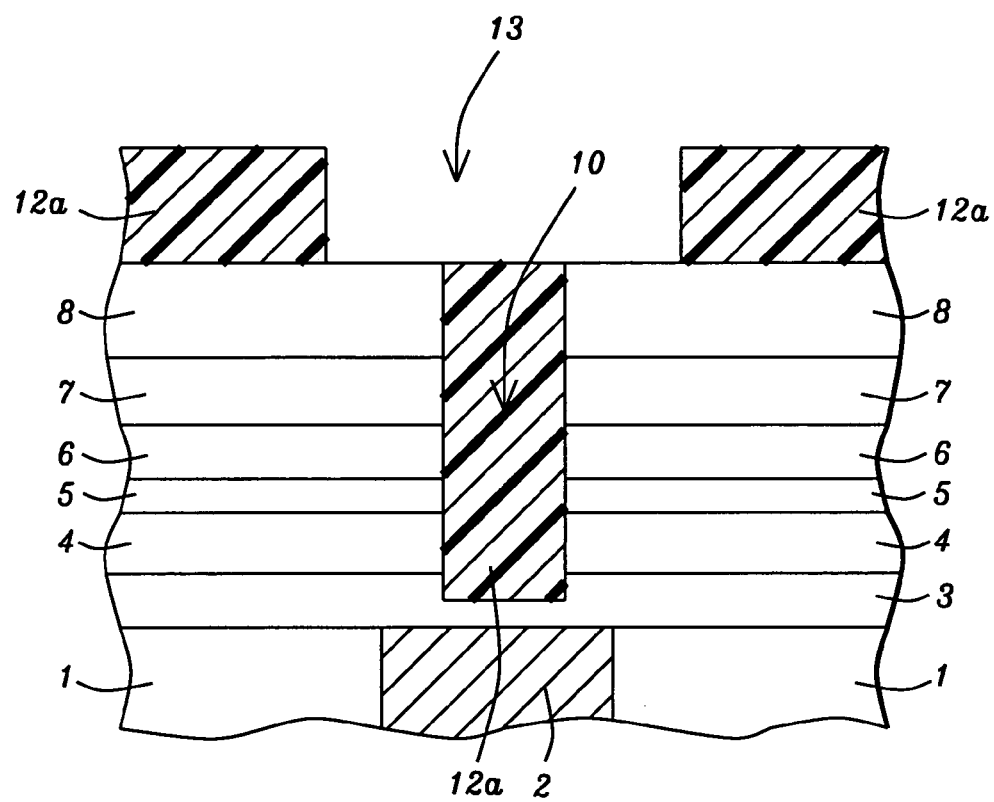
Figure 4:
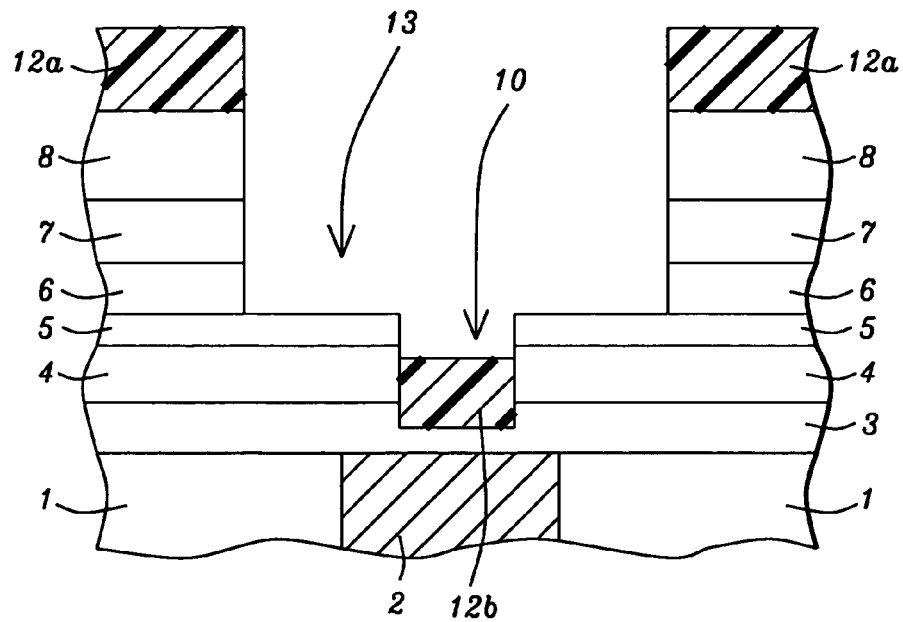

The procedure used to form a photoresist plug in a bottom portion of via opening 10, as well as to form a trench opening in a top portion of the insulator stack is next addressed and schematically illustrated in FIGS. 3–4. Photoresist shape 12a, shown schematically in FIG. 3, is next formed completely filling via opening 10, with photoresist shape 12a, featuring trench shape opening 13, which exposes a portion of the top surface of capping oxide layer 8. A dry etch procedure employed to form the trench shape of the dual damascene opening, and to form a photoresist plug at the bottom of the narrow diameter via opening of the dual damascene opening in next addressed. A selective, anisotropic RIE procedure performed using $CHF_3$ as an etchant, is employed to transfer or define trench opening 13, in underlying insulator layers, specifically defining trench shape 13, in capping oxide layer 8, in ARC layer 7, and in insulator layer 6, with the anisotropic RIE procedure selectively terminating at the appearance of second liner layer 5, comprised of silicon nitride. The same anisotropic RIE procedure results in an etch back of the portion of photoresist shape 12a, located in narrow diameter via opening 10, resulting in the formation of photoresist plug 12b, in the bottom portion of via opening 10, wherein photoresist plug 12b, is located overlying a portion of the top surface of conductive structure 2. This is schematically shown in FIG. 4. The top surface of photoresist plug 12b, is located below the bottom surface of second liner layer 5.

Figure 5:
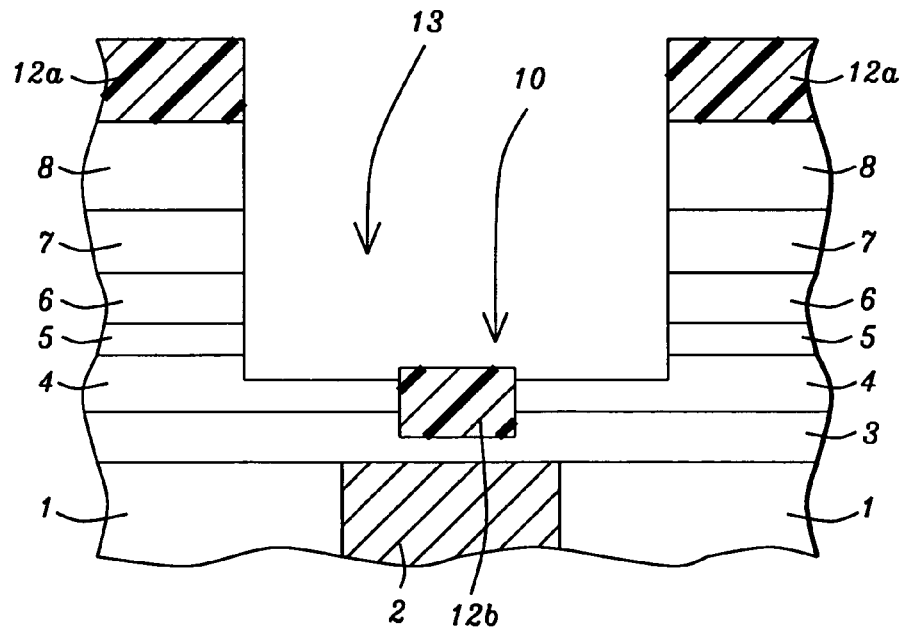

With second photoresist shape 12a, and with photoresist plug 12b, in place, the first of the two step liner removal procedure is performed. A selective RIE procedure using $CF_4$ or $CH_xF_y$ as a selective etchant for the portions of second liner layer exposed in trench shape opening 13, is performed featuring selective termination of the RIE procedure on the top surface of, or in a top portion of FSG layer 4. Photoresist plug 12b, located on a portion of first liner layer 3, protected silicon nitride, first liner layer 3, during the first stage of the two step liner removal procedure. This is schematically shown in FIG. 5. The selectivity of the RIE procedure resulted in only between about 50 to 150 Angstroms of thinning of FSG layer 4, during the first step of the two step liner removal procedure. In addition the presence of photoresist shape 12a, prevented unwanted corner rounding of capping oxide layer 8.

Figure 6:
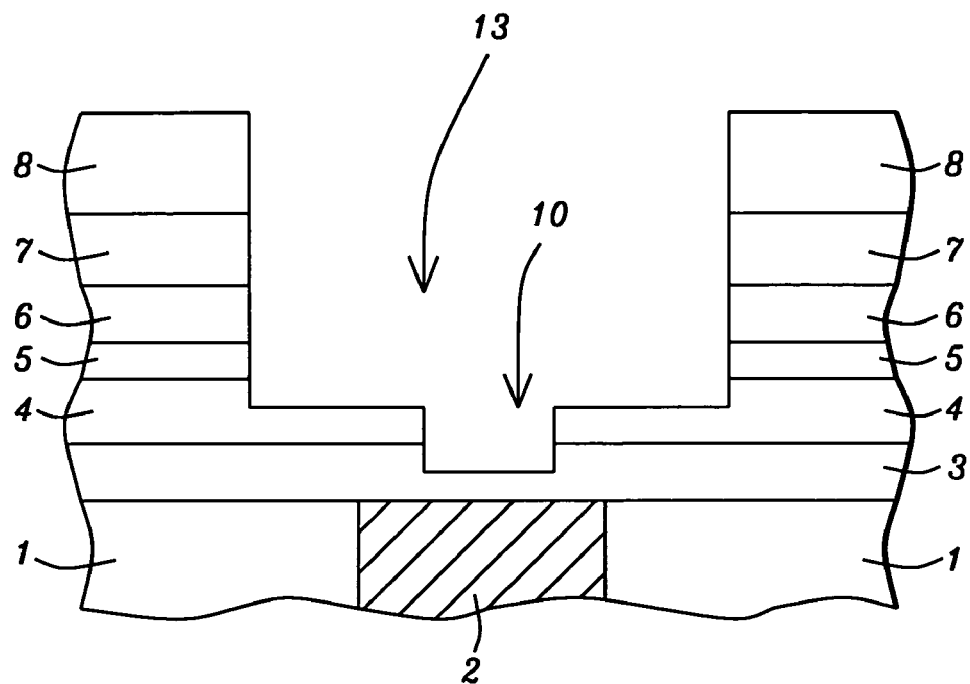
Figure 7:
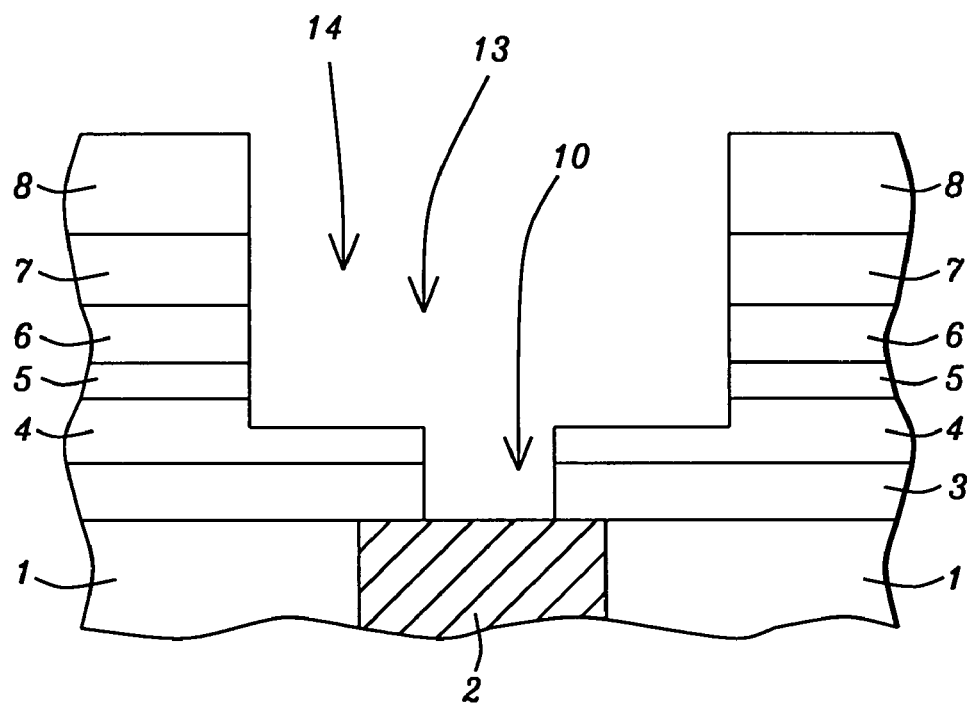

Removal of photoresist shape 12a, and of photoresist plug 12, is next accomplished via plasma oxygen ashing procedures, resulting in exposure of partially etched first liner layer 3, located in at the bottom of via opening 10. This is schematically shown in FIG. 6. Another selective RIE procedure is employed to remove the portion of first liner layer 3, exposed in via opening 10. The selective RIE procedure is accomplished using $CF_4$ or $CH_xF_y$ as an etchant for the silicon nitride first liner layer, with an etch rate ratio of silicon nitride to either FSG or silicon oxide of about between about 5 to 1, to 10 to 1. The etch rate ratio or etch rate selectivity for the first liner removal procedure resulted in only a minimum of FSG removal, between about 50 to 100 Angstroms, and removal of only between about 50 to 100 Angstroms of capping oxide layer 8. In addition the selective RIE first liner layer removal procedure did not result in rounded corners at the top surface of capping oxide layer 8, nor did damage occur to the top surface of conductive structure 2, at conclusion of the selective REE first liner layer removal procedure. The result of this procedure, featuring dual damascene opening 14, comprised of trench opening 13, and via opening 10, exposing a portion of the top surface of conductive structure 2, is schematically shown in FIG. 8.

While this invention has been particularly shown and described with reference to, the preferred embodiments thereof, it will be understood by those skilled in the art that various changes in form and details may be made without departing from the spirit and scope of this invention.

What is claimed is:

1. A method of forming an opening in a stack of insulator layers, comprising the steps of:
   providing a conductive structure;
   forming said stack of insulator layers on said conductive structure, with said stack of insulator layers comprised of a first liner layer, an overlying first insulator layer, a second liner layer, an overlying second insulator layer, an antireflective coating (ARC), layer; and a capping, third insulator layer;
   forming a via opening in a first portion of said stack of insulator layer, with said via opening extending downwardly from a top surface of said capping, third insulator layer and terminating in said first liner layer;
   forming a photoresist shape including a trench-defining shape and a photoresist plug that completely fills said via opening up to said top surface, said trench-defining shape exposing a second portion of said stack of insulator layers;
   forming a trench opening in said second portion of said stack of insulator layers using said trench-defining shape as an etch mask, with said trench opening extending downwardly from a top surface of said capping, third insulator layer and terminating on top surface of said second liner layer,
   removing a portion of said second liner layer exposed in said trench opening;
   removing said photoresist shape including said photoresist plug; and removing a portion of said first liner layer exposed in said via opening, exposing a portion of a top surface of said conductive structure.

2. The method of claim 1, wherein said conductive structure is comprise of copper.

3. The method of claim 1, wherein said first liner is a silicon nitride layer, obtained via plasma enhanced chemical vapor deposition (PECVD) procedures at a thickness between about 400 to 600 Angstroms.

4. The method of claim 1, wherein said first insulator layer is a fluorinated silica glass (FSG) layer, obtained via PECVD procedures at a thickness between about 500 to 1000 Angstroms.

5. The method of claim 1, wherein said second liner layer is a silicon nitride layer, obtained via PECVD procedures at a thickness between about 200 to 400 Angstroms.

6. The method of claim 1, wherein said second insulator layer is a silicon oxide layer, obtained via PECVD procedures at a thickness between about 500 to 1000 Angstroms.

7. The method of claim 1, wherein said ARC layer is a silicon oxynitride layer, obtained via PRCVD procedures to a thickness between about 500 to 700 Angstroms.

8. The method of claim 1, wherein said capping, third insulator layer is a silicon oxide layer, obtained via PECVD procedures at a thickness between about 500 to 700 Angstroms.

9. The method of claim 1, wherein said via opening is defined in said capping, third insulator layer, in said ARC layer, in said second insulator layer, in said second liner layer, and in said first insulator layer, via an anisotropic reactive ion etching (RIE) procedure, using $CHF_3$ as an etchant for said capping, third insulator layer, for said second insulator layer, for said ARC layer and for said first insulator layer, while $CH_xF_y$ or $CF_4$ is used as an etchant for said second liner layer.

10. The method of claim 1, wherein the diameter of said via opening is between about 0.25 to 2.5 um.

11. The method of claim 1, wherein said trench opening is defined in said capping, third insulator layer, in said ARC layer, and in second insulator layer via an anisotropic RIE procedure using $CHF_3$ as an etchant.

12. The method of claim 1, wherein portion of said second liner layer exposed in said trench opening, is removed via a selective RIE procedure using $CF_4$ or $CH_xF_y$ as an etchant.

13. The method of claim 1, wherein said photoresist shape is removed using plasma oxygen ashing procedures.

14. The method of claim 1, wherein portion of said first liner layer exposed in said via opening, is removed via a selective RIE procedure using $CF_4$ or $CH_xF_y$ as an etchant.

15. The method of claim 1, wherein the etch rate ratio of silicon nitride of said first liner layer, to silicon oxide, during the selective RIE procedure used to remove portion of said first liner layer exposed in said via opening, is between about 5 to 1, to 10 to 1 using $CF_4$ or $CH_xF_y$ as an etchant.

16. A method of forming a dual damascene opening in a stack of insulator layers featuring a two step stop layer removal procedure, comprising the steps of:

providing a copper structure;

forming said stack of insulator layers on said copper structure, with said stack of insulator layers comprised of an underlying first silicon nitride stop layer, an overlying first dielectric layer, a second silicon nitride stop layer, a second dielectric layer, an anti-reflective coating (ARC) layer, and a capping silicon oxide layer;

forming a via opening in a first portion of said stack of insulator layer, with said via opening extending downwardly from a top surface of said capping silicon oxide layer and terminating in said first silicon nitride stop layer;

forming a photoresist shape including a trench-defining shape and a photoresist plug that completely fills said via opening up to said top surface and overlies a portion of a surface of said first silicon nitride layer, said trench-defining shape exposing a second portion of said stack of insulator layers;

etching to form a trench opening in said second portion of said stack of insulator layers using said trench-defining shape as an etch mask, with said trench opening extending downwardly from a top surface of said capping silicon oxide layer and terminating on said surface of said second silicon nitride stop layer;

performing a first step of said two step stop layer removal procedure to selectively remove a portion of said second silicon nitride stop layer exposed in said trench opening;

removing said photoresist shape including said photoresist plug; and performing a second step of said two step stop layer removal procedure to remove a portion of said first silicon nitride stop layer exposed in said via opening, exposing a portion of a top surface of said copper structure.

17. The method of claim 16, wherein said first silicon nitride stop layer is obtained via plasma enhanced chemical vapor deposition (PECVD) procedures at a thickness between about 400 to 600 Angstroms.

18. The method of claim 16, wherein said first dielectric layer is an FSG layer, obtained via PECVD procedures at a thickness between about 500 to 1000 Angstroms.

19. The method of claim 16, wherein said second silicon nitride stop layer is obtained via PECVD procedures at a thickness between about 200 to 400 Angstroms.

20. The method of claim 16, wherein said second dielectric layer is a silicon oxide layer, obtained via PECVD procedures at a thickness between about 500 to 1000 Angstroms.

21. The method of claim 16, wherein said ARC layer is a silicon oxynitride layer, obtained via PECVD procedures to a thickness between about 500 to 700 Angstroms.

22. The method of claim 16, wherein said capping, silicon oxide layer is obtained via PECVD procedures at a thickness between about 500 to 700 Angstroms.

23. The method of claim 16, wherein said via opening is defined in said capping silicon oxide layer, in said ARC layer, in said second dielectric layer, in said second silicon nitride stop layer, and in said first dielectric layer via an anisotropic reactive ion etching (RIE) procedure, using $CHF_3$ as an etchant for said capping silicon oxide layer, for said ARC layer and for said second dielectric layer and for said first dielectric layer, while $CF_4$ or $CH_xF_y$ is used as an etchant for said second silicon nitride stop layer.

24. The method of claim 16, wherein the diameter of said via opening is between about 0.25 to 2.5 um.

25. The method of claim 16, wherein said trench opening is defined in said capping silicon oxide layer, in said ARC layer, and in said second dielectric layer, via an anisotropic RIE procedure using $CHF_3$ as an etchant.

26. The method of claim 16, wherein said first step of said two step stop layer removal procedure, used to selectively remove portion of said second silicon nitride stop layer exposed in said trench opening, is performed via a selective RIE procedure using $CF_4$ or $CH_xF_y$ as an etchant.

27. The method of claim 16, wherein said photoresist shape is removed using plasma oxygen ashing procedures.

28. The method of claim 16, wherein said second stop of said two step stop layer removal procedure, used to selectively remove portion of said first silicon nitride stop layer exposed in said via opening, is performed via a selective RIE procedure using $CF_4$ or $CH_xF_y$ as an etchant.

29. The method of claim 16, wherein the etch ratio of silicon nitride to silicon oxide, during said second step of said two step stop layer removal procedure performed via a selective the selective RIE procedure used to remove portion of said first silicon nitride stop layer exposed in said via opening, is between about 5 to 1, to 10 to 1 using $CF_4$ or $CH_xF_y$ as an etchant.

* * * * *

UNITED STATES PATENT AND TRADEMARK OFFICE
CERTIFICATE OF CORRECTION

PATENT NO. : 7,001,836 B2 Page 1 of 1
APPLICATION NO. : 10/808802
DATED : February 21, 2006
INVENTOR(S) : Yang et al.

It is certified that error appears in the above-identified patent and that said Letters Patent is hereby corrected as shown below:

Column 7, line 5, delete "stop" and insert "step".

Signed and Sealed this

Eighteenth Day of July, 2006

JON W. DUDAS
*Director of the United States Patent and Trademark Office*